(12) United States Patent
Rhoades

(10) Patent No.: US 11,731,007 B2
(45) Date of Patent: Aug. 22, 2023

(54) WIRELESS BILLIARD BALL DEVICE

(71) Applicant: Nathan Rhoades, East Taunton, MA (US)

(72) Inventor: Nathan Rhoades, East Taunton, MA (US)

( * ) Notice: Subject to any disclaimer, the term of this patent is extended or adjusted under 35 U.S.C. 154(b) by 141 days.

(21) Appl. No.: 17/216,586

(22) Filed: Mar. 29, 2021

(65) Prior Publication Data

US 2021/0331041 A1    Oct. 28, 2021

Related U.S. Application Data

(60) Provisional application No. 63/016,031, filed on Apr. 27, 2020.

(51) Int. Cl.
| | | |
|---|---|---|
| *A63B 43/00* | (2006.01) | |
| *H02J 50/10* | (2016.01) | |
| *H05K 1/18* | (2006.01) | |
| *H05K 3/28* | (2006.01) | |
| *A63D 15/00* | (2006.01) | |

(52) U.S. Cl.
CPC .......... *A63B 43/004* (2013.01); *A63D 15/006* (2013.01); *H02J 50/10* (2016.02); *H05K 1/181* (2013.01); *H05K 3/28* (2013.01); *A63B 2220/34* (2013.01); *A63B 2220/40* (2013.01); *A63B 2220/53* (2013.01); *A63B 2225/54* (2013.01); *A63B 2243/002* (2013.01); *H05K 2201/10098* (2013.01)

(58) Field of Classification Search
None
See application file for complete search history.

(56) References Cited

U.S. PATENT DOCUMENTS

| | | | | |
|---|---|---|---|---|
| 5,761,096 | A * | 6/1998 | Zakutin | A63B 43/00 368/2 |
| 6,148,271 | A * | 11/2000 | Marinelli | G01C 21/16 473/200 |
| 8,540,560 | B2 * | 9/2013 | Crowley | A63B 24/0062 463/4 |
| 8,645,085 | B2 * | 2/2014 | Morris | A63D 15/006 702/41 |
| 9,522,306 | B1 * | 12/2016 | Ganson | A63B 43/004 |
| 10,163,364 | B2 * | 12/2018 | Loftsgard | A63B 71/0619 |
| 10,238,922 | B2 * | 3/2019 | Krysiak | A63B 41/08 |
| 10,688,366 | B1 * | 6/2020 | Petrich | A63B 37/006 |

(Continued)

Primary Examiner — Sunit Pandya
(74) Attorney, Agent, or Firm — Nathan Rhoades

(57) ABSTRACT

Described herein are wireless billiard ball devices comprising a spherical housing and a circuit board mounted within the spherical housing, the circuit board having components for measuring the impact location of a billiard cue strike upon the surface of the spherical housing in reference to the relative orientation of the device with respect to gravity. The devices described herein do not require manual alignment by a player to measure impact location data. In other embodiments, the spherical housing is comprised of a bored hole, a potting material, and a circuit board mounted within the bored hole and secured in place with the potting material, the circuit board having components for measuring the impact location of a billiard cue strike upon the surface of the spherical housing in reference to the relative orientation of the device with respect to gravity.

12 Claims, 7 Drawing Sheets

(56) References Cited

U.S. PATENT DOCUMENTS

| | | | | |
|---|---|---|---|---|
| 2003/0027650 A1* | 2/2003 | Tompert | ............... | A63D 15/006 |
| | | | | 473/2 |
| 2011/0130230 A1* | 6/2011 | Solberg | ................. | A63B 43/00 |
| | | | | 473/570 |
| 2011/0304497 A1* | 12/2011 | Molyneux | ............. | G01S 13/751 |
| | | | | 342/42 |
| 2013/0274040 A1* | 10/2013 | Coza | .................... | A63B 43/004 |
| | | | | 473/570 |
| 2018/0036616 A1* | 2/2018 | McKenney | .......... | A63B 69/002 |
| 2019/0168081 A1* | 6/2019 | Tattersfield | ........... | A63B 37/004 |
| 2022/0168623 A1* | 6/2022 | Park | ...................... | A63F 13/245 |

* cited by examiner

WIRELESS BILLIARD BALL DEVICE

CROSS-REFERENCE TO RELATED APPLICATION

This application claims the benefit of U.S. Provisional Patent Application No. 63/016,031, filed Apr. 27, 2020, which is incorporated by reference herein in its entirety.

BACKGROUND

The game of billiards and its various forms, such as pool, snooker and carom, involve striking a cue ball with a billiard cue to cause the ball to roll with a predetermined amount of speed and spin. The intention may be to cause a collision with another object ball, a collision with a rail, or a combination of the two. A player must use great skill in predicting the paths of all balls involved in the collisions to score points by, for example, pocketing an object ball in a pocket of a pool table, or making a carom. Further, the player must execute the strike by causing the tip of the billiard cue to contact a precise and accurate location on the surface of the cue ball to realize predictable results.

If the actual tip impact location does not match the intended tip impact location, the player may not score a point, pocket a ball, or cause the cue ball to come to rest in the desired location upon the playing surface. Further, because the strike happens quickly and the cue ball leaves the field of vision immediately upon impact, the player may not be able to observe if the execution was imprecise. The player may instead blame the poor result on other game variables such as humidity, table condition, his method of aiming, or distractions from the opponent, leading to frustration.

There have been a variety of tools to aid a pool player in determining the tip impact location on the surface of the cue ball. Such tools have typically relied upon retention and inspection of a chalk mark. One such tool, described in U.S. Pat. No. 5,716,283, is a practice ball with a spherical outer surface that is movable along a playing surface as the result of having impact by a billiard cue with a tip coated in chalk. The practice ball comprises indicia imprinted upon the surface of the ball. The ball is formed of a material having surface characteristics selected to receive and retain a chalk mark from the cue tip. The ball is aligned to the shot line by the player so that the player may imprint a chalk mark upon the ball for inspection and analysis when the ball has become motionless at a later time.

Other tools also include indicia on the outer surface of the ball. U.S. Pat. No. 8,057,319, for example, discloses a training ball for use in pool type games with indicia placed on the exterior of the surface of the ball for the player to visualize the relationship of the training ball to another ball. The indicia comprise of a geometric array of visually coded and unique bounded shapes. The method of use is for the player to cause a cue ball to strike a particular bounded shape at the collision contact point. U.S. Pat. No. 6,866,590, describes a similar tool.

U.S. Pat. Appl. No. 2005/0064946 describes a training ball with a transparent outer covering and an opaque core. The method of use described is for a player to align a billiard cue with the training ball and direct the cue towards the ball in reference to the visible opaque inner core for imparting spin or no spin while limiting deflection to the training ball.

Although tools have been developed and described that purport to allow a player to determine the location of the impact of a cue tip on a cue ball, there are deficiencies in the tools that are currently available. It takes effort on the part of a player to manually align the center of the indicia or visible ball core to the shot line. This must be done by hand and by best judgement. If the player's perspective of the center of the indicia is inaccurate, then the orientation of the indicia may not be in alignment with the shot line. Therefore, the location of any chalk mark later inspected will not accurately represent the true impact location in reference to the shot line. Also, during motion, it is possible for the cue ball to make contact with the table cloth, a rail, or another ball at the location of the chalk mark imprint. This contact degrades or removes the imprint. The cue ball may also come to rest in a position where the chalk mark is obscured from view. Finally, it is a very common rule that touching or moving the cue ball in any way other than for the execution of a shot is illegal. The usual result is a foul. Under these circumstances the player cannot align the cue ball to the shot line, and further, cannot use the currently available or described tools to play games under the normal sets of rules or during competitive matches.

Knowledge of the exact impact location in comparison to the predicted impact location provides valuable feedback to players by promoting improvement through corrections in knowledge, muscle memory, stance, stroke execution, and expectations. Therefore, there is a need for an accurate means for determining impact location without the requirement of the player touching the cue ball in any way between shots.

SUMMARY

In accordance with one embodiment, a billiards ball for measuring the impact location of a billiard cue strike upon the surface of a cue ball is disclosed. The billiard ball has a spherical housing. The spherical housing has a bored hole. The spherical housing has a potting material for filling the bored hole. A circuit board is mounted within the bored hole and secured with the potting material. The circuit board measures the impact location of a billiards cue strike upon the surface of the spherical housing. The billiard ball can be used as a device to measure and wirelessly transmit impact location data for presentation to the player. The circuit board has operably coupled components. The circuit board has an accelerometer for generating acceleration data. The circuit board has a gyroscope for generating rotational velocity data. The circuit board has a microprocessor for acquiring data from the accelerometer and the gyroscope. The microprocessor generates impact location data. The circuit board has a radio transmitter. The radio transmitter wirelessly transmits impact location data. The circuit board has a radio antenna. The center of masses of the circuit board, potting material, and spherical housing are coincident. The radio antenna is tuned for optimal efficiency from within the spherical housing and potting material at the transmission frequency used by the radio transmitter. The radio antenna is a meandering antenna. The circuit board is conformal coated for shock protection. The circuit board has a wireless charge coil. The circuit board has an energy storage device. Alternating current received by the wireless charge coil is converted into direct current and stored in the storage device in the form of electric charge. The billiard ball may be a cue ball.

BRIEF DESCRIPTION OF THE DRAWINGS

For a more complete understanding of the features and advantages described herein, reference is made to the "Detailed Description" along with the accompanying figures.

DETAILED DESCRIPTIONS OF THE DRAWINGS

Described herein is a device that measures the impact location of the strike of the tip of a billiard cue upon the surface of a cue ball in reference to the relative orientation of the device with respect to gravity. The device is an engineered cue ball, as described herein, comprising one or more or all of a microprocessor, gyroscope and accelerometer within the ball, which is continuously powered. The microprocessor acquires and retains data from the accelerometer and gyroscope periodically. The acceleration is proportional to the magnitude and direction of the force of gravity while the device is at rest, and is used as a reference for the orientation of the device (henceforth known as the "orientation vector"). The microprocessor detects, through active monitoring, any abrupt changes of the orientation vector. When such a change occurs, the microprocessor assumes that the change was caused by a billiard cue strike. The microprocessor then compares the current rotational velocity and impact acceleration to the previously stored orientation vector, and calculates the estimated distance and angle of the impact location from points on the equator of the ball orthogonal to the orientation vector. The microprocessor sends this information to a radio transmitter. The radio transmitter radiates the data within the 2.4 GHz ISM band. The transmission protocol is Bluetooth Low Energy. A receiving device intercepts the transmitted data and formats it for presentation to the player. In an alternative embodiment the radio transmitter radiates the data within a different frequency band. In another alterative embodiment the radio transmitter emits modulated light. In another alternative embodiment, the radio transmitter transduces the data acoustically. In another alternative embodiment the transmission protocol is Wi-Fi. In another embodiment, the data transmission protocol is any other suitable protocol.

Figure 1:
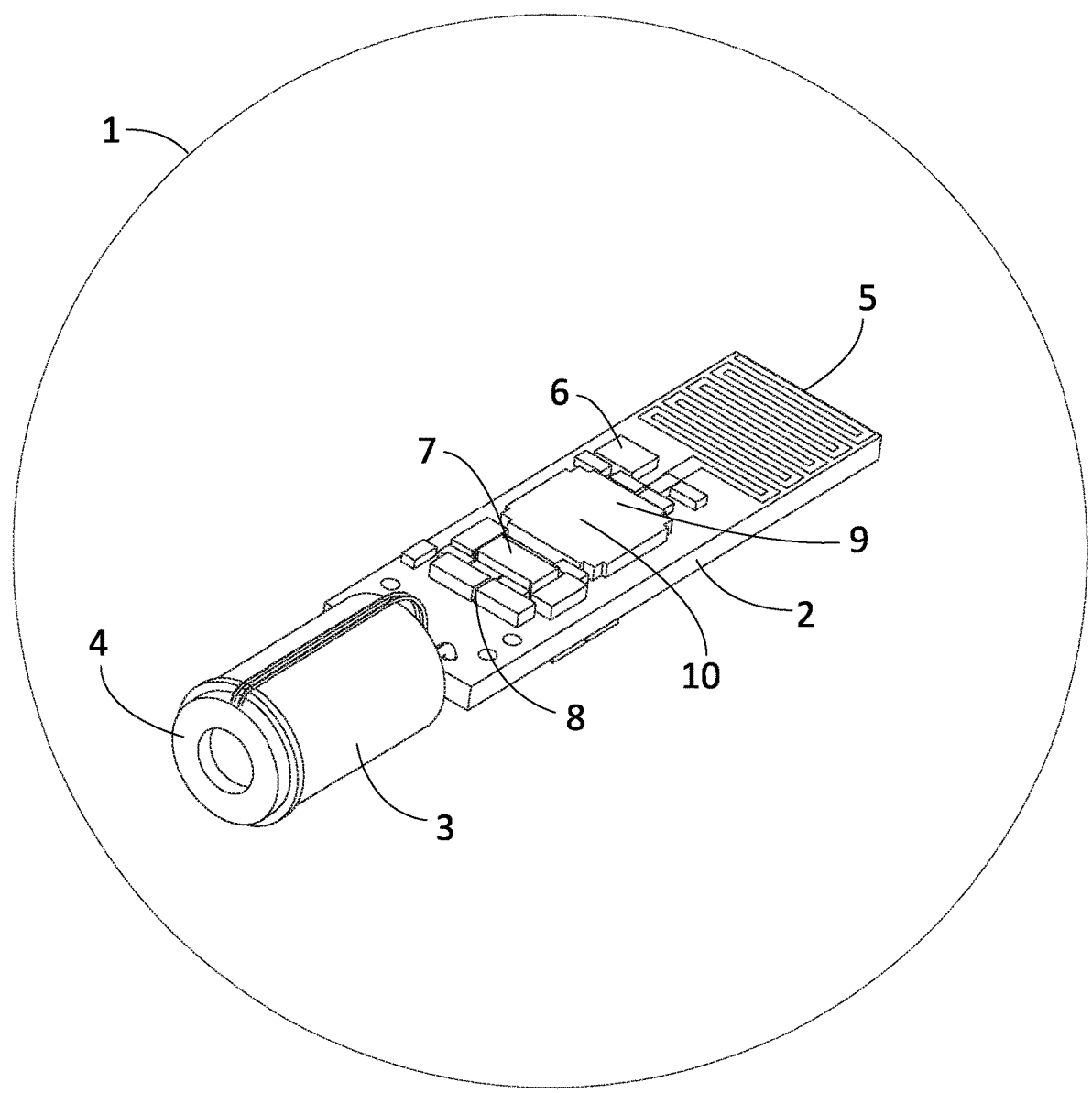
FIG. 1 shows an assembly isometric view of a wireless billiards ball measurement device, consisting of a circuit board surrounded and encased by a spherical housing.

An exemplary device is shown in FIG. 1 and consists of a circuit board [2] encased and surrounded by a spherical housing [1]. The spherical housing [1] material is a phenolic resin, although the device described herein can be of any suitable composition, e.g., a plastic. The diameter of the spherical housing is 2.25 inches with a ten percent variance. In an alternative embodiment the diameter of the spherical housing may be 2.4375 inches with a ten percent variance. In another alternative embodiment the diameter of the spherical housing may be 2.07 inches with a ten percent variance. In another alternate embodiment, the spherical housing is of sufficient diameter for the intended purpose of playing a billiard or pool game. The center of mass of the circuit board [2] and the spherical housing [1] are coincident [8]. The circuit board [2] is made in such a way that the distribution of components mounted to the circuit board [2] are as close to the center of the circuit board [2] as possible. The circuit board [2] is made in such a way that the moment of inertia is sufficiently close to center of the circuit board [2]. The meaning of the term "coincident" is "a distance equal or less than one inch in any direction in space." The circuit board [2] can be made of, for example, FR4 material. The thickness of the FR4 material is approximately 0.062 inches. Within the FR4 material is embedded four layers of copper, each with a thickness of approximately 0.0014 inches. The outer surface of the top and bottom copper layers is gold plated, although other suitable materials can be used. An energy storage device [3] is mounted to the circuit board as the power source. The energy storage device [3], for the purposes of this example, is a hybrid super capacitor. The maximum voltage of the energy storage device [3] is 4.2 volts. In an alternate embodiment the energy storage device [3] may be an electrostatic double layer capacitor (ELDC). In an alternate embodiment the energy storage device may be lithium-ion battery. In an alternate embodiment, the electrolyte of the energy-storage device is operable at high temperatures. In the embodiment shown, the energy storage device is mounted at a right angle to the circuit board [2] with a wireless charge coil [4] mounted to one end with an adhesive. In an alternate embodiment the energy storage device [3] may be vertically mounted. In an alternate embodiment the energy storage device [3] may be mounted to the center of the circuit board [2]. In an alternate embodiment the energy storage device [3] may be mounted in a different orientation. The wireless charge coil [4] is disposed 0.14 inches to the inside perimeter of the spherical housing [1] to optimize reception of alternating current during charging. In an alternate embodiment the charge coil may be disposed in a different location. The wireless charge coil [4] accepts alternating current and through a rectification stage on the circuit board is down-converted to an appropriate charge voltage. The charge voltage is 4.1 volts. In an alternate embodiment the charge voltage is sufficient to appropriately charge the energy storage device. The energy from the charge voltage is stored in the energy storage device [3] in the form of electric charge. The operating frequency of the wireless charge coil [4] is 150 kHz. In an alternate embodiment the charge frequency is any other suitable frequency. The wireless charge coil [4] includes a magnetic pad. The circuit board [2] is conformal coated. The conformal coating material is silicone. In an alternate embodiment the conformal coating may be low-hardness epoxy or any other suitable material. The conformal coating thickness can be, for example, less than 0.005 inches. In an alternate embodiment the conformal coating thickness may be up to 0.5 inches.

Also shown mounted to the circuit board [2] is an accelerometer [6], a gyroscope [7], a microprocessor [10] and a radio transmitter [9]. In the displayed embodiment, the radio transmitter [9] and the microcontroller [10] coexist within the same component. The component is a System-On-Chip (SoC). In an alternate embodiment the microprocessor [10] and radio [9] may be separate components. All components shown mounted to the circuit board [2] are, for example, electrically and operably coupled. The accelerometer [6] and gyroscope [7] both generate motion data of the complete billiard ball assembly due to the fact that all parts of the assembly are rigidly mounted. The accelerometer [6] specifically generates orientation data while the assembly is at rest by detecting the gravitational vector. The data are stored as the orientation vector. The accelerometer [6] also specifically generates impact vector data by detecting the impact magnitude and direction of force of a billiard cue striking upon the surface of the spherical housing. The gyroscope [7] specifically generates rotational velocity data by detecting the axis and magnitude of spin caused by a billiard cue striking upon the surface of the spherical housing. The microprocessor [7] acquires the data from the accelerometer [6] and gyroscope [7], processes the data, calculates the impact location of the billiard cue strike. The impact location data includes a distance and an angle from the origin, the origin being any point on the surface of the cue ball that is orthogonal to the orientation vector. The set of all of these points is equivalent to the ball equator that is parallel to the playing surface since it is reasonably assumed that the playing surface is level and also orthogonal to gravity. The impact location is accurate regardless of the absolute orientation of the exemplary device, and therefore, does not require manual alignment to the shot line by the player.

The microprocessor sends impact location data to the radio transmitter [9]. In an alternate embodiment the microprocessor [7] acquires the data from the accelerometer [6] and gyroscope [7], and sends the orientation data, impact data, and rotational velocity data to the radio transmitter [9].

Shown on the circuit board [2], the right end of the top layer of copper is etched into the shape of an antenna [5]. The antenna [5] is a meandering type antenna with a specific geometry as to optimize its gain at 2.45 GHz under the circumstances of the antenna's near field. The near field is affected by the spherical housing [1] material due to the close proximity of the material to the antenna [5]. The material property that most closely represents the influence of the material on the near field is the dielectric constant. Air has a dielectric property of approximately 1. The majority of pre-made, 2.45 GHz commercial surface mountable antennas are designed for operation in air with a dielectric constant of 1. Said pre-made antennas cannot be used for transmission because the spherical housing material capacitively loads the near field and lowers the tuned frequency. The antenna insertion loss plot [20] of FIG. 5. shows a simulation of reflected power returned to the source of the antenna [5] when driven with varying frequencies at 0 decibels. Each trace in the plot represents the reflected power predicted with different spherical housing dielectric constants. The dielectric constants used to generate the five traces are 2, 3, 4, 5 and 6. The insertion loss [21] represents that, on average and for each dielectric constant simulation, approximately −20 dB (one-hundredth) of the power is reflected back to the source when driven at 2.45 GHz. This phenomenon is interpreted to represent the fact that energy cannot be created nor destroyed, and therefore the power transmitted must be radiated by the antenna [5]. The width of the valleys represents the antenna bandwidth. The radio transmitter [9] in the displayed embodiment uses Bluetooth Low Energy (BLE) as a modulation scheme. In an alternate embodiment an alternate modulation scheme may be utilized. In the current embodiment the data radiated, shown as [23] in FIG. 4, by the antenna [5] may be decoded by a radio receiver [24] into impact location data. In an alternate embodiment the data radiated [23] by the antenna [5] may be decoded by the radio receiver [24] into orientation data, impact vector data, rotational velocity data.

By way of this non-limiting example, the output of the radio transmitter [9] circuitry is matched to 50 ohms. For optimal efficiency, the input impedance of the antenna [5] is matched to 50 ohms within a variance of 25 ohms. The antenna impedance at 2.45 GHz plot [22] shows simulated input impedances of the antenna [5] for varying dielectric constants of the spherical housing [1]. The plot [22] shows through simulation that optimal antenna efficiency centered at 2.45 GHz is satisfied. Further it is shown that the antenna [5] is efficient for a range of spherical housing dielectric constants, which relaxes the requirement that the dielectric constant of the spherical housing material be tightly controlled.

Figure 2:
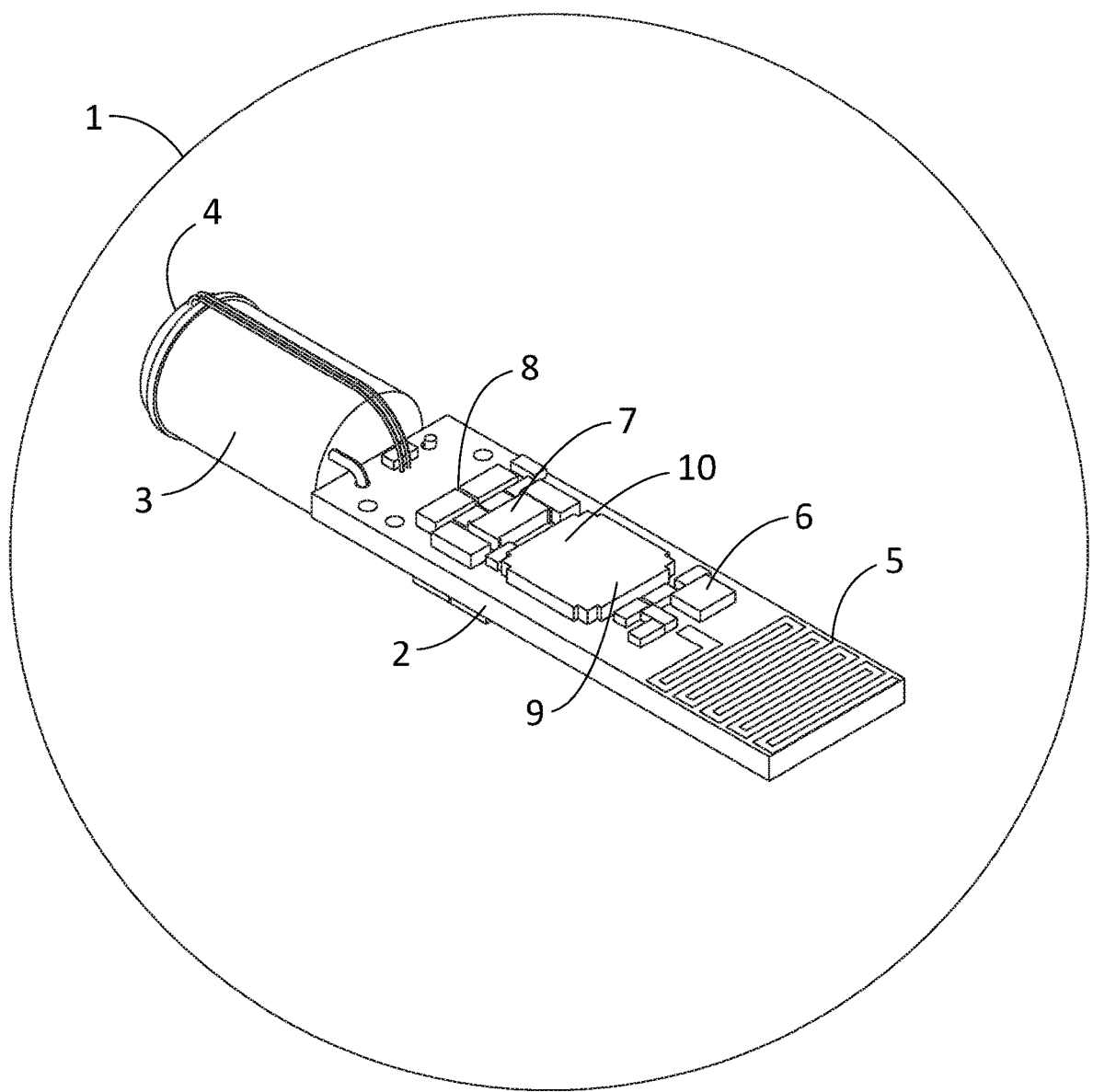
FIG. 2 shows an alternate assembly isometric view of a wireless billiards ball measurement device, consisting of a circuit board surrounded and encased by a spherical housing.

FIG. 2 shows an alternate isometric view of the exemplary device.

Figure 3:
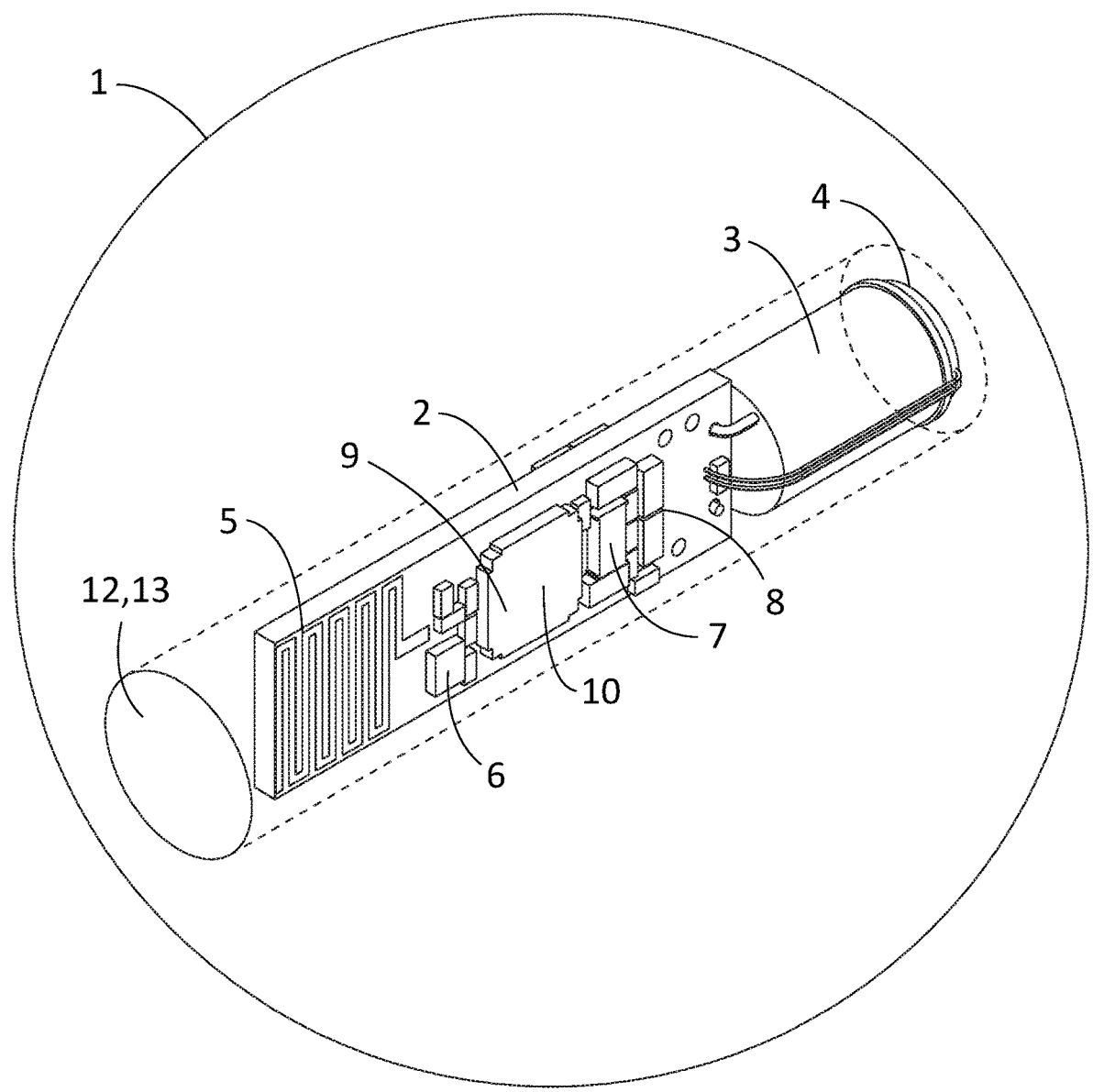
FIG. 3 shows an assembly isometric view of a wireless billiards ball measurement device, consisting of a circuit board mounted inside a bored hole within a spherical housing, and secured in place with a potting material.

FIG. 3 shows an isometric view of the exemplary device with a bored hole represented by dashed lines [12].The circuit board [2] as described above is deposited within the bored hole and secured with potting material [13]. The bored hole [12] diameter is at least the width of the circuit board [2]. The depth of the bored hole is 2.14 inches. In an alternate embodiment the depth of the bored hole may be a different length. In an alternate embodiment the potting material first encases the circuit board taking the shape of the interior of the bored hole as a mold, and is then inserted into the bored hole as a secure friction fit. In an alternate embodiment the circuit board is potted inside of a Nylon tube and is then inserted into the bored hole. In an alternate embodiment one end of the tube contains a Teflon plug to act as a counterweight. In an alternate embodiment the mass of the circuit board and potting material divided by the total volume of the circuit board and potting material equal the density of the spherical housing material [1]. The antenna [5] geometry is adjusted for optimal efficiency at 2.45 GHz for operating from within the combination of the potting material [13] and spherical housing [1]. The potting material [13] is, for example, structural epoxy. In an alternate embodiment, the potting material [13] is the same material as the spherical housing [1]. In an alternate embodiment, the potting material is a combination of both structural epoxy and spherical housing material.

Figure 4:
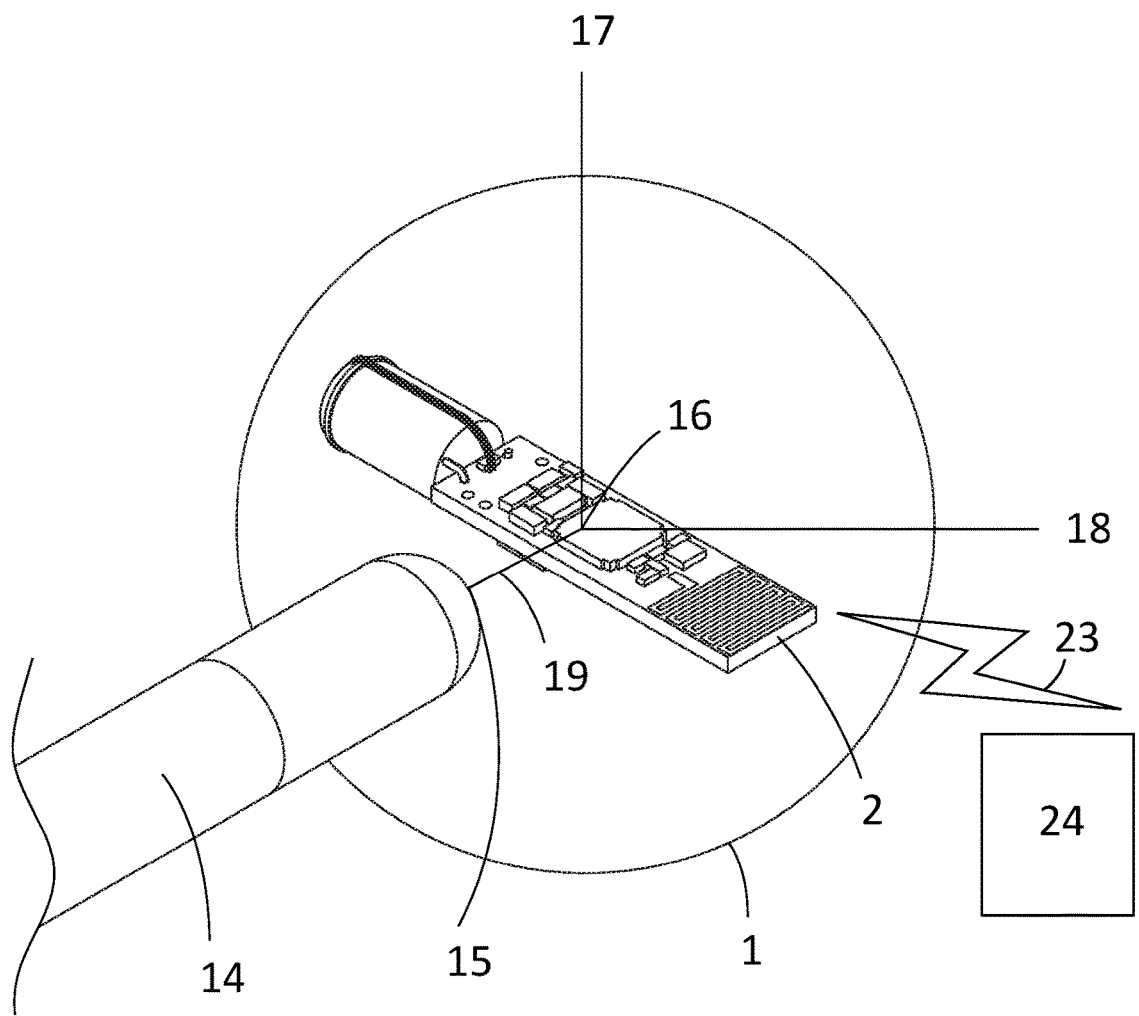
FIG. 4 shows an isometric view of a billiard cue striking the surface of a wireless billiards ball measurement device and transmitting data to a receiving device.
Figure 5:
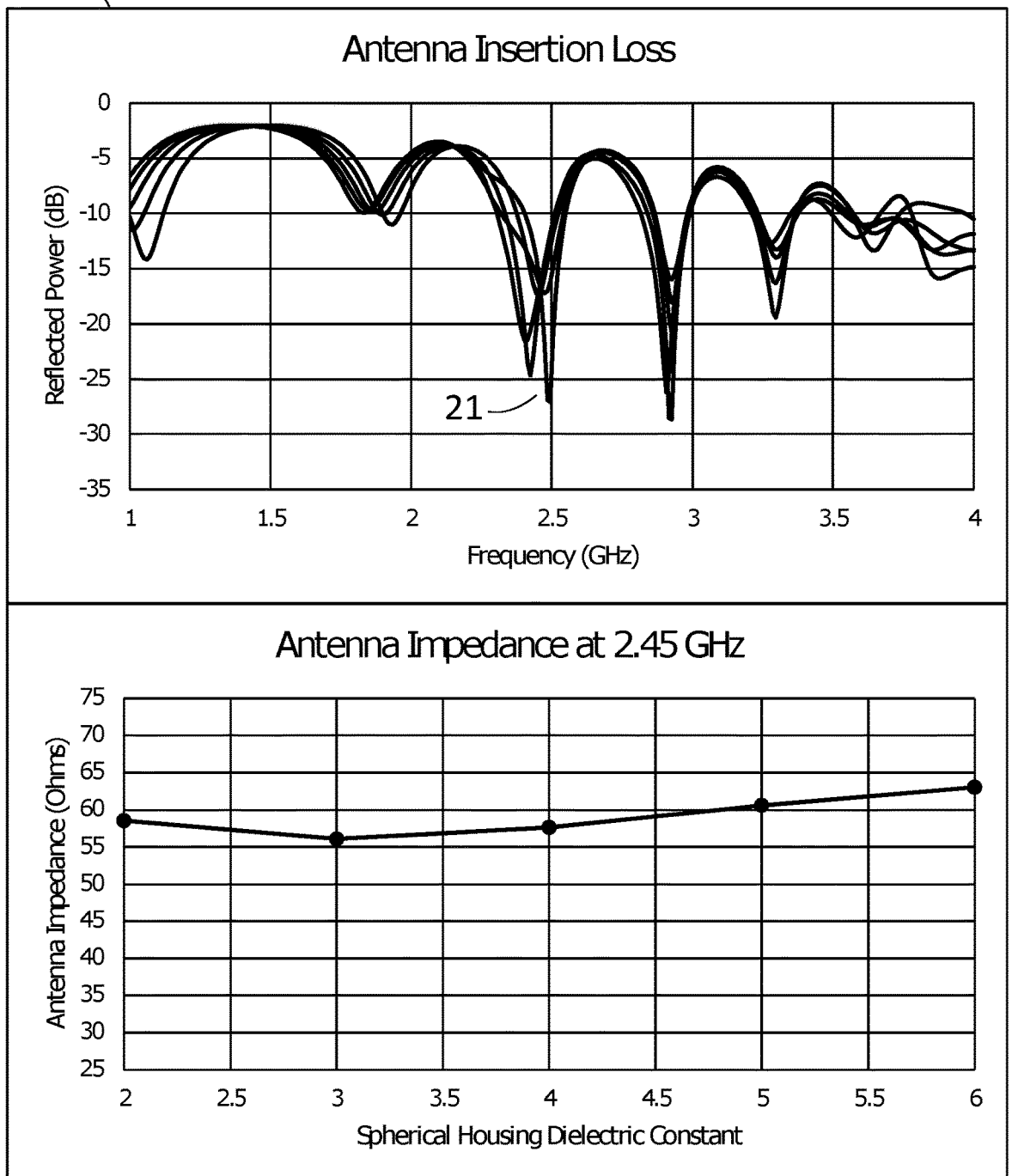
FIG. 5 shows simulated plots of the insertion loss and input impedance of the antenna for various dielectric constants assigned to the spherical housing material.

FIG. 4. shows the spherical housing [1] and circuit board [2] assembly described in the embodiments above. Further, the figure shows a billiards cue [14] impacting the outer surface of the spherical housing [1] at the contact point [15]. Before impact, the assembly is at rest, and the microprocessor acquires accelerometer data from the accelerometer [6] and stores it in memory. The pre-impact accelerometer data represents the orientation vector [17]. During impact, the microprocessor acquires data from the accelerometer [6], which represents the vector of the impact acceleration [19]. The microprocessor also acquires data from the gyroscope [7], which represents the rotational velocity vector [18] of the spherical housing. The microprocessor [10] processes the data acquired during impact in reference to the orientation vector [17] previously acquired, and generates the impact location data describing the impact location [15] as described previously in this section. The microprocessor [10] then passes the impact location data to the radio transmitter [9]. In an alternative embodiment the microprocessor [10] passes the gravitational vector data, impact vector data, and rotational velocity data directly to the radio transmitter [9]. The radio transmitter [9] radiates the data through the antenna [5]. The radiated data [23] is intercepted by a radio receiver [24] that presents the data to the player.

Figure 6:
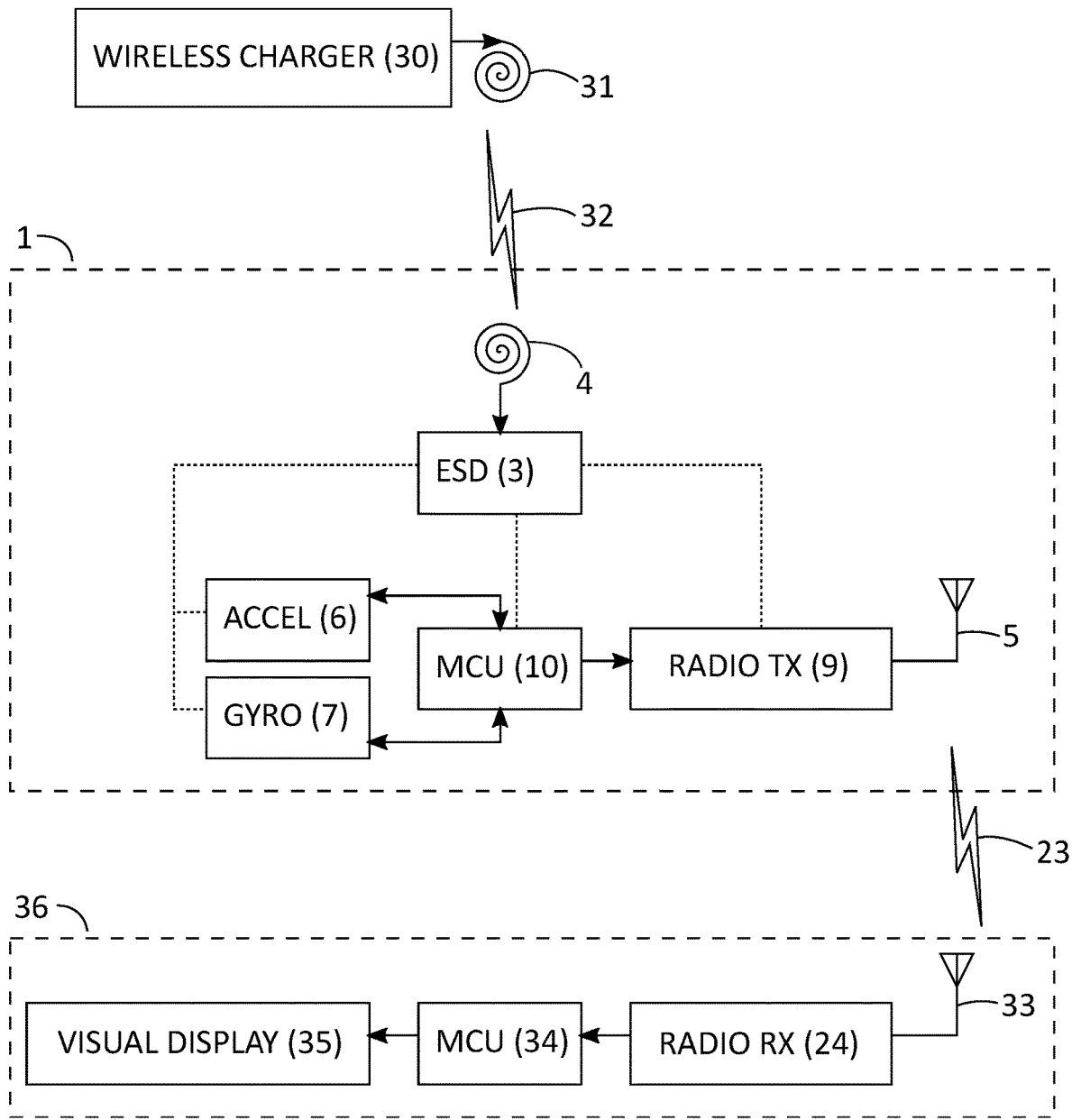
FIG. 6 shows a system block diagram of the interactions between a wireless charger, the wireless billiard ball, and a receiver display device.

FIG. 6. illustrates the operation of the wireless billiard ball device [1] within a systematic block diagram. A wireless charger [30] is operably coupled to a second wireless charge coil [31] and is provided with a power source. The power source may be, for example, a 5V USB port. The wireless charger operates at 150 kHz. In an alternate embodiment, the wireless charger may operate at a different frequency. The wireless charger [30] is external to the wireless billiard ball device [1]. When the wireless billiard ball device [1] is brought into operable proximity to the wireless charger [30] and the mutual inductance between the wireless charge coil [4] with the wireless charge coil [31] is increased, electromagnetic energy [32] will flow from the wireless charger into the energy storage device [3]. The current is regulated by charging circuitry. The energy storage device [3] is operably coupled to provide power to an accelerometer [6], gyroscope [7], microprocessor [10] and radio transmitter [9] designated by dashed lines in the figure.

The accelerometer [6] and gyroscope [7] are in communication with the microprocessor [10]. The microprocessor is in communication with the radio transmitter [9]. The microprocessor is continuously running software that monitors accelerometer and gyroscope data, and sends data to the radio transmitter for transmission through the radio antenna [5] as radiated data [23] based on dynamic events. A receiver display device [36] contains a radio receiver [24] in communication with a microprocessor [34] running a user application [101]. The microprocessor [34] is in communication with a visual display [35]. The radiated data [23] is received by the radio receiver [24] and sends it to the microprocessor [24]. The user application [101] processes the data and generates graphics on the visual display [35] for the user to interpret and interact with.

Figure 7:
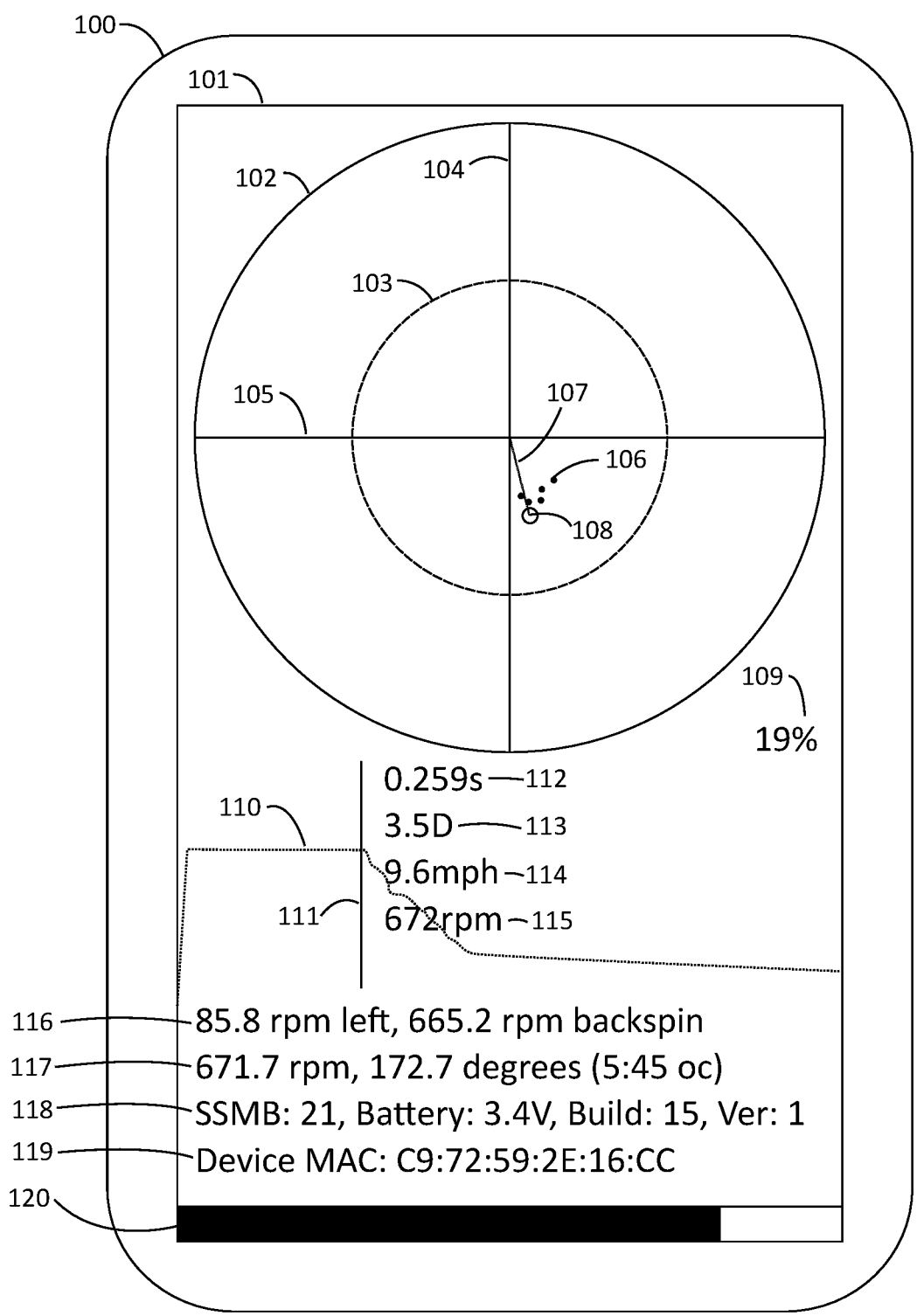
FIG. 7 shows one embodiment of an end user application running on a smartphone.

FIG. 7 illustrates an embodiment of a user application to present impact location data to the user. For this example, a device such as a smart phone, tablet, laptop, computer, touchscreen or LED array [100] runs the user application [101]. Displayed in the user application is a large circle [102] and a smaller circle [103]. These circles represent the outer diameter and half diameter of a cue ball, respectively. The vertical line [104] represents the vertical center the cue ball, parallel with gravity. The horizontal line [105] represents the horizontal center of the cue ball, perpendicular to gravity and parallel to the playing surface. The impact location circle [108] represents the most recent impact location of a billiard cue striking the surface of the spherical housing [1]. The line drawn from the center of the ball [107] represents the angle and distance from center of the impact location circle [108]. The impact location dots [106] are instances of past impact location circles [108] that the user has chosen to allow to persist on the screen for purposes of analyzing repetition accuracy via statistical accumulation. The percentage indicator [109] shows the impact location [108] as a percentage of cue ball radius from cue ball center.

Spin magnitude data (0.9 seconds) [110] sampled at 100 Hz is displayed below the large circle [102]. The purpose of these data is for the user to identify the time between collision [112] of the cue ball and an object ball (or any other obstacle). A collision is almost always observable by an abrupt change in spin magnitude; therefore, the user is to observe this data and find the first discontinuity within the spin magnitude data. A slider [111] is moved by the user dragging his finger across the smart phone screen and over the first discontinuity to identify the time between collision [112]. Additionally, the user is to observe the distance between the cue ball and the object ball. On a pool table this is easily determined, for example, by estimating the number of diamonds. On a nine-foot pool table one diamond is equivalent to 12.5 inches. The distance between objects [113] is entered by the user sliding his finger up or down along the slider. The combination of time between collision [112], distance between objects [113] and the instantaneous spin magnitude [115] allows for the user application to display the cue ball speed [114] in addition to the impact location [108].

Below the spin magnitude data [110] further information displayed. Line one [116] shows the Cartesian components of impact spin as "left," "right," "top," and "backspin." This is useful for players evaluating the type of spin, or for focusing on aligning their stroke with the vertical line [104] and adopting the goal of minimizing left/right spin results. Line two [117] shows the impact spin magnitude (total spin) and angle in both degrees and hour-hand clock-face format ("oc"). Line three [118] shows the SSMB (Seconds-Since-Motionless-Ball), which can be used as a feature to trigger an alarm for a shot clock in the user application. More diagnostic information such as battery voltage, firmware version and device MAC address [119] is also available for observation in this embodiment. A battery life meter [120] is visible at the bottom of the screen.

What is claimed is:

1. A billiard ball comprising:
   a) a spherical housing comprising;
      i) a bored hole; and
      ii) a potting material for filling the bored hole;
   b) a circuit board mounted within the bored hole and secured with a potting material wherein the circuit board comprises components for measuring the impact location of a billiard cue strike upon the surface of the spherical housing;
      wherein the billiard ball can be used as a device to measure and wirelessly transmit impact location data to a receiving device.

2. The billiard ball of claim 1, wherein the circuit board comprises operably coupled components, the components comprising one or more of:
   a) an accelerometer for generating acceleration data;
   b) a gyroscope for generating rotational velocity data;
   c) a microprocessor for acquiring data from the accelerometer and the gyroscope wherein the microprocessor generates impact location data;
   d) a radio transmitter for wirelessly transmitting the impact location data; and
   e) a radio antenna.

3. The billiard ball of claim 1, wherein the center of masses of the circuit board, potting material, and spherical housing are coincident.

4. The billiard ball of claim 2, wherein the radio antenna is tuned for optimal efficiency from within the spherical housing and potting material at the transmission frequency used by the radio transmitter.

5. The billiard ball of claim 4, wherein the radio antenna is a meandering antenna.

6. The billiard ball of claim 1, wherein the circuit board is conformal coated for shock protection.

7. The billiard ball of claim 2, wherein the components further comprise:
   a) a wireless charge coil; and
   b) an energy storage device;
      wherein alternating current received by the wireless charge coil is converted into direct current and stored in the storage device in the form of electric charge.

8. The billiard ball of claim 1, wherein the potting material is finished to match the outer curvature of the spherical housing.

9. The billiard ball of claim 1, wherein the potting material is a structural epoxy.

10. The billiard ball of claim 1, wherein the billiard ball is a cue ball.

11. The billiard ball of claim 1, wherein the potting material is the same material as the spherical housing.

12. The billiard ball of claim 1, wherein the total masses of the circuit board, potting material, and spherical housing divided by the total volume of said components, equals the density of the spherical housing material.

\* \* \* \* \*